United States Patent

Sugawa et al.

[11] Patent Number: 6,143,369
[45] Date of Patent: Nov. 7, 2000

[54] PROCESS OF IMPREGNATING SUBSTRATE AND IMPREGNATED SUBSTRATE

[75] Inventors: Yoshihisa Sugawa; Yasuo Tohrin; Yoshinobu Marumoto; Joji Sakakibara, all of Yokkaichi; Ken-ichi Shinotani, Ibaraki; Kohei Kotera, Suita; Kenji Ogasawara, Hirakata; Keiko Kashihara, Ibaraki; Tomoaki Iwami, Shijonawate, all of Japan

[73] Assignee: Matsushita Electric Works, Ltd., Osaka, Japan

[21] Appl. No.: 08/773,947

[22] Filed: Dec. 30, 1996

[30] Foreign Application Priority Data

Jan. 12, 1996 [JP] Japan ................................. 8-004307
Mar. 21, 1996 [JP] Japan ................................. 8-064322

[51] Int. Cl.[7] ................................. B05D 1/36; B05D 1/18
[52] U.S. Cl. ....................... 427/407.3; 427/411; 427/412; 427/434.3
[58] Field of Search ....................... 427/179, 288, 427/407.3, 434.3, 411, 412; 428/375, 306.3, 307.3; 442/43, 58

[56] References Cited

U.S. PATENT DOCUMENTS

| 3,526,536 | 9/1970 | Spengos et al. ................ 117/120 |
| 4,076,867 | 2/1978 | Lewicki, Jr. et al. ............ 427/264 |
| 4,116,162 | 9/1978 | Dinter et al. .................... 118/104 |
| 4,464,432 | 8/1984 | Dost et al. ...................... 428/280 |
| 4,588,615 | 5/1986 | Otty ................................ 427/294 |
| 4,866,134 | 9/1989 | Takano et al. .................. 525/109 |
| 5,354,376 | 10/1994 | Aidun ............................. 118/410 |
| 5,436,031 | 7/1995 | Payer ............................. 427/289 |
| 5,470,647 | 11/1995 | Zimics et al. .................... 428/229 |

FOREIGN PATENT DOCUMENTS

| 5-29548 | 4/1993 | Japan . |
| 93/23461 | 11/1993 | WIPO . |
| 95/10366 | 4/1995 | WIPO . |

*Primary Examiner*—Paul Thibodeau
*Assistant Examiner*—Holly C. Rickman
*Attorney, Agent, or Firm*—Greenblum & Bernstein, P.L.C.

[57] ABSTRACT

Process of impregnating a layer substrate having openings which is substantially defined by opposing two main surfaces with a resin composition in the form of liquid, and the process is characterized in that one of the main surfaces and the resin composition are kept in such a contact condition that the substrate is located on the resin composition. A prepreg and a laminate are also provided which are produced by the use of the substrate which has been prepared by the above process.

17 Claims, 6 Drawing Sheets

PROCESS OF IMPREGNATING SUBSTRATE AND IMPREGNATED SUBSTRATE

BACKGROUND OF THE INVENTION

1. Field of the Invention

The present invention is related to a process of impregnating a substrate having openings, in particular a continuous such substrate, for example a fabric such as cloth or mat made of various kinds of fibers with a resin composition in the form of liquid such as a vanish, an impregnated substrate with a resin composition using such a process and an article made of such an impregnated substrate, for example a so-called prepreg (i.e. pre-impregnate) and a laminated material.

As used herein, the resin composition is intended to mean a composition which comprises at least one component of a resin, and the resin composition may contain, in addition to such a resin component, other component(s) such as a solvent, a polymerizable monomer and/or a polymerization initiator. The resin composition in the form of liquid is intended to mean that such a resin composition is in a liquid state at a temperature at which the present process is carried out. The resin composition is preferably a solution, but it may be a dispersion or a suspension as far as no practical problem occurs. Concretely, the resin composition in the form of liquid herein includes, in addition to a resin composition which is liquid in its natural state (or a liquid resin composition), a composition prepared by dissolving such a liquid resin composition by a solvent and a composition which is prepared by dissolving a resin composition in the form of solid into a solvent. For example, a varnish (i.e. a resin composition dissolved into a solvent) and a so-called "resin varnish" (i.e. a resin composition which is inherently liquid even without dissolving into a solvent, for example a vinyl ester resin and a thermosetting resin composition comprising styrene) are herein examples of the resin composition in the form of liquid.

2. Description of the Prior Art

A prepreg (or a substrate which has been impregnated with a resin composition) which is used for the production of a laminate is generally produced by impregnating a substrate in the form of a layer having a fine open-cell structure with a resin varnish and drying and/or curing such a substrate. As the substrate, an elongated continuous substrate is usually used. The prepreg can be produced in a series of continuous steps of impregnating the continuous substrate with the resin varnish while supplying the substrate continuously, and further passing the impregnated substrate continuously through an oven so as to dry and/or cure the resin varnish.

As manners to impregnating a continuous substrate with a resin varnish as described above, there are a dipping method (in which the continuous substrate is dipped in the resin varnish in a vessel while supplying the substrate continuously), a showering method (in which the resin varnish is showered on the continuous substrate) and so on.

The dipping method has a problem that non-impregnated portions are very likely to be left in the interior of the substrate since the resin varnish tries to enter the interior of the substrate from both sides of the substrate so that air in the interior is sealed by the such resin varnish and the sealed air finally leads to bubbles. The showering method has a difficulty in high speed impregnation.

Then, a kiss-roll coating method has been proposed for example in U.S. Pat. No. 4,076,867. Referring to FIG. 6, the kiss-roll coating method is carried out by supplying a continuous substrate 1 as shown with an arrow while it is contacted with a periphery of a kiss-roll 11 which is placed in a varnish vessel 10 containing a resin varnish 2, so that the resin varnish 2 is coated on one side of the continuous substrate 1 by the kiss-roll 11. It has been stated that bubbles (or air) are unlikely to be sealed within the substrate 1 by the resin varnish 2 since the resin varnish 2 penetrates into the continuous substrate 1 from the one side thereof.

The kiss-roll coating method, however, has a problem that the continuous substrate 1 contacts with the kiss-roll 11 at a predetermined pressure (namely, a kiss pressure) so that the resin varnish is forced into the substrate, which causes insufficient impregnation leaving non-impregnated portions.

In connection with this problem, the following considerations are possible:

Referring to FIGS. 7(a) and (b) each of which schematically shows a cross-sectional view of a glass cloth 1 as a continuous substrate made of glass yarns 12, when the kiss-roll coating method is employed, one side (bottom surface) of the continuous substrate 1 contacts with the kiss-roll 11 at the kiss pressure so that the resin varnish 2 is passed through relatively wide openings between the yarns 12 (as shown with the arrows) in a short time to overflow onto the other side (top surface) of the continuous substrate 1, which seals the yarns 12 with the resin varnish 2 as shown in FIG. 7(a). Thus, air in small interstices (or openings) between filaments (not shown) which constitute the yarns 12 are confined in the resin varnish 2 and such air cannot escape from the surrounding resin varnish 2, and therefore the resin varnish 2 cannot penetrate into the interior of the yarns 12, which makes the non-impregnated portions left.

Further, since the continuous substrate 1 is continuously fed along its longitudinal direction, the substrate is under effects of its ambient circumstances, such as a wind due to the continuous feeding of the continuous substrate 1 and other air flow due to any other cause. For example, when the wind blows on the surface of the substrate as shown with the arrows in FIG. 7(b), a component having a lower boiling point which is contained in the resin varnish 2 tends to evaporate from exposed surface portions of the impregnated resin varnish 2 (namely, portions which contact with air). Then, the resin varnish of such exposed portions becomes more viscous, which suppresses the impregnation of the resin varnish into the interior of the yarns 12 by means of the capillary action so that non-impregnated portions are likely to be left. For example, with respect to a resin varnish 2 containing styrene monomer as a cross-linking agent, the problem tends to occur when some wind blows over the substrate 1 since styrene is ready to evaporate and a viscosity of the resin varnish becomes larger.

BRIEF SUMMARY OF THE INVENTION

The inventors have considered the above problems, and intended to provide a process which impregnates a substrate having openings, in particular a continuous substrate having openings in the form of the open-cell structure with a resin composition such as a resin varnish and which is carried out at a high speed.

The present invention provides a process of impregnating a layer substrate having openings which is substantially defined by opposing two main surfaces with a resin composition in the form of liquid (namely, filling the openings with the resin composition), which process is characterized in that one of the main surfaces and the resin composition are kept in such a contact condition that the substrate is located on the resin composition. In the present invention, the main surfaces are understood to be hypothetical flat and smooth surfaces which defines the substrate overall in the form of the layer. Concretely, referring to FIGS. 7(a) and (b) which schematically show the layer substrate 1, the main surfaces corresponds to a top surface 1a and a bottom surface 1b which define the substrate 1 together.

In the process according to the present invention, the other main surface which is not in contact with the resin composition is substantially free, and therefore, such other main surface merely contacts with a gas such as air which is located above the surface.

In the process according to the present invention, the wording "such a contact condition that the substrate is located on the resin composition" herein used is intended to include:

a condition in which an interface between one of the main surfaces of the substrate and a body of the resin composition is substantially horizontal and the substrate is located on a top surface of the body of the resin composition (which condition is referred to as "a horizontal condition" of an angle of 0 degree), and a condition in which the interface of the horizontal condition is inclined and the substrate is still on the top (or upper) surface of the body of the resin composition (which condition is referred to as "an inclined condition"), namely a condition in which the interface is rotated around an axis which is included by the interface, preferably such an axis which is perpendicular to a longitudinal direction of the substrate by up to +90° (degrees) or up to −90° from the horizontal condition.

In other words, provided that no other force rather than the gravity force acts on the body of the resin composition and the substrate, the wording is intended to exclude a condition in which the gravity force acting on the body of the resin composition substantially acts on the substrate. The term "body of the resin composition" herein used is intended to mean a bulk of the resin composition which is in contact with the main surface of the substrate, and corresponds to a portion of the resin composition which is located beneath the bottom surface 1b in FIG. 7(a) when the present process is carried out. Therefore, with respect to "such a contact condition that the substrate is located on the resin composition," portions of the resin composition which have been already impregnated into the interior of the substrate do not have to be considered. In the condition in which one of the main surfaces of the substrate is kept in contact with the resin composition, at least a portion of the substrate, preferably most of the substrate and more preferably substantially all of the substrate is substantially flat, and such a substrate is made to contact with the resin composition in the horizontal condition or the inclined condition. Thus, in one aspect, the present invention is directed to a process for impregnating a substrate with a liquid resin composition, the substrate including opposing upper and lower surfaces, and openings providing liquid communication between the upper and lower surfaces, comprising contacting the lower surface of the substrate with a liquid resin composition while the upper surface is substantially free; and maintaining contact of the lower surface on a top surface of the liquid resin composition for a period of time to impregnate the substrate. The present invention is also directed to substrates produced by such process, and prepregs and laminates including such substrates.

DETAILED DESCRIPTION OF THE INVENTION

Figure 1:
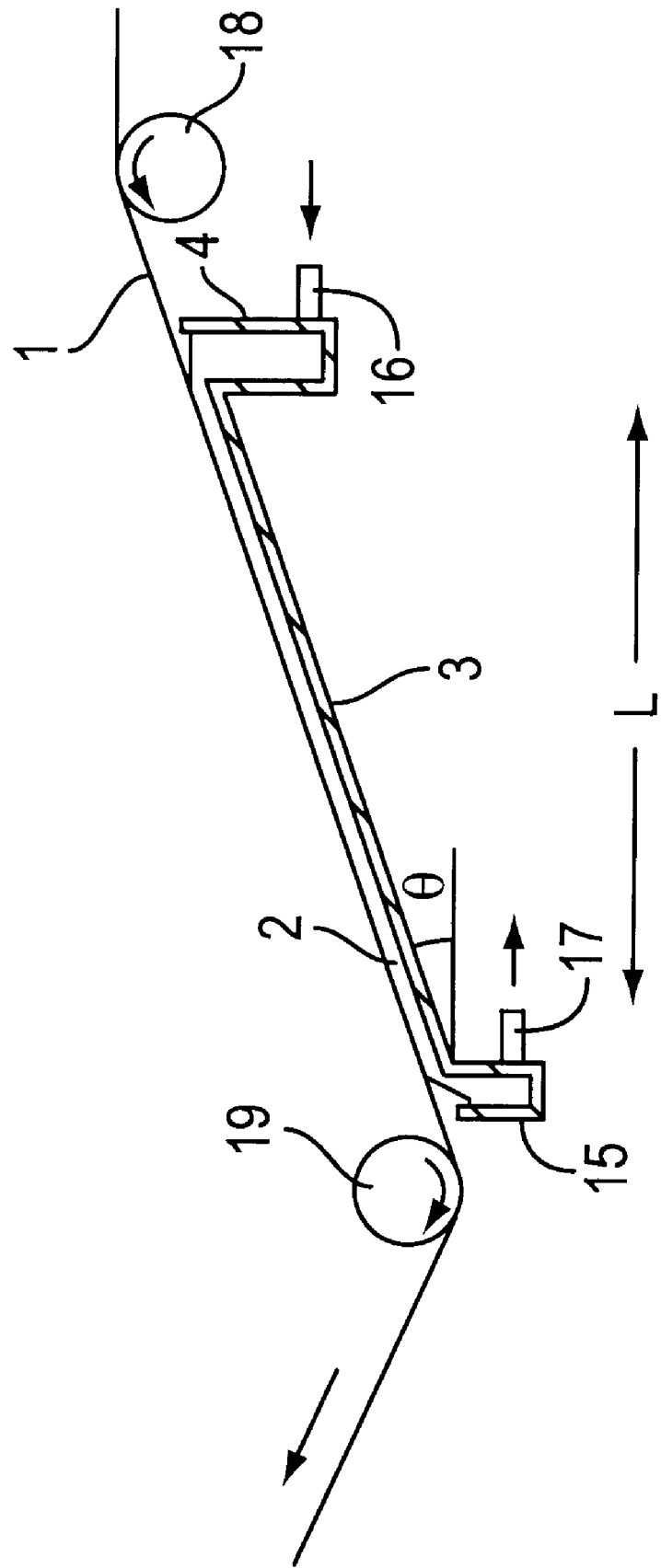
FIG. 1 schematically shows an embodiment of an apparatus with which the process according to the present invention is carried out.

In the present inventions, the openings of the substrate in the form of the layer communicate both of the main surfaces, and therefore the substrate preferably has the openings in the form of the open-cell structure. The substrate containing such openings may be a fabric, for example a woven, a knitted or a braided material, but it may be also a non-woven material such as non-woven fabric. Alternatively, the substrate may be in the form of a so-called foam. In the present invention, the substrate may be substantially elongated and preferably substantially continuous. Thus, the substrate may be a fabric wound on a roll in the present invention and it is continuously fed to the present impregnation process.

Concretely, as long as the substrate has openings, it may be made of yarns (i.e. threads which constitute the substrate) of any kind of fibers. For example, cloth, paper or mat may be used as the substrate which is made of yarns of at least one selected from inorganic fibers (such as glass fibers, ceramic fibers and so on), organic fibers (such as polyester fibers, polyamide fibers, polyacrylic fibers, polyimide fibers and so on) and natural fibers (cellulose fibers, cotton and so on). The yarn which constitutes the substrate may be a monofilament yarn or a multifilament yarn. In particular, when the process according to the present invention is applied to the impregnation of the substrate made of the multifilament yarns, there is provided an advantage that the relatively smaller interstices between the filaments which constitute the yarns are effectively impregnated with the resin composition in addition to the relatively larger interstices between the yarns.

The resin composition which is used in the present invention is not particularly limited as long as it is to be impregnated and it is the resin composition in the form of liquid as defined in the above. For example, a resin composition which is used for the production of the laminate may be exemplified. A concrete resin which may be contained in the resin composition includes an epoxy resin, a phenol resin, a polyimide resin, a melamine resin, and a resin which contains a radically polymerizable unsaturated double bond group and which is cured by radical polymerization of the unsaturated group (such as a curable resin of a radical polymerization type), for example an unsaturated polyester resin, an epoxy acrylate resin, a dialliylphthalate resin, a vinyl ester resin, a polyester acrylate resin, an urethane resin and a spiran resin and so on. The resin composition may contain, in addition to the resin as the above, a polymerizable monomer as a cross-linking agent (such as styrene) and/or a polymerization initiator. Further, the resin composition may contain an inorganic filler (such as silica or calcium carbonate), a solvent which adjusts a viscosity of the resin composition or which makes the composition into the liquid form (for example, ketones such as acetone, alcohols such as methanol and amides such as N,N dimethylformamide).

A particularly preferable resin composition which is used in the process according to the present invention comprising the following components:
(A) a rubber-modified vinyl ester resin obtained by reacting:
  (a) an epoxy resin,
  (b) an amino group and/or a carboxylic group containing rubbery polymer derived from a conjugated diene (for example, an acrylonitrile butadiene rubber having a terminated carboxylic group), and
  (c) acrylic acid and/or methacrylic acid,
(B) a radically polymerizable monomer (for example, styrene, acrylic acid, and methacrylic acid), and
(C) a radical polymerization initiator (for example, methylethylketone peroxide and cumene hydroperoxide)

The above resin composition is thermosetting (or heat curable), of which details are described in Japanese Patent Kokai Publication No. 3-73339 (which corresponds to Japanese Patent Kokoku Publication No. 5-29548, U.S. Pat. No. 4,866,134, U.K. Patent No. 2158830 and German Patent Application Publication No. 3512791A1), disclosures of these patents are herein incorporated by reference.

Among the compositions just described in the above, the most preferable resin composition which is used in the present process is one in which as the component (B), styrene and an OH group containing monomer which is radically polymerizable (such as acrylic acid, methacrylic acid, tetramethylolmethane triacrylate and tetramethylolmethane trimethacrylate) are contained and an amount of the OH group containing monomer is 4 to 8% by weight based on the total of the resin composition. This resin composition is preferably used for the production of the laminate such as a copper clad laminate. This most preferable resin composition is disclosed in Japanese Patent Application No. 8-64322 (filed on Mar. 21, 1996), disclosure of which is herein incorporated by reference.

These resin compositions are relatively highly viscous and thus it is not sufficiently impregnated into the substrate with the conventional impregnation methods. However, it has been found that the process of the present invention can achieve improved impregnation.

In the present invention, a period during which the substrate and the resin composition are kept in the contact condition (i.e. a holding time) is generally one during which a predetermined impregnation is achieved, and it is dependent on various factors such as a kind of the substrate to be used (including substrate characteristics such as a thickness, a size of the opening, a yarn constituting the substrate), a kind of the resin composition to be used (including its viscosity and its composition), an impregnation temperature, optionally a feed rate of the substrate and so on. Based on the disclosure herein, those skilled in the art could select a suitable holding time by a proper manner (such as a try-and-error manner) once the substrate, the resin composition and the other operation conditions to be employed are once selected. In order to impregnate the substrate with the resin composition as in the case of the present invention, some amount of time is generally required, and therefore the holding time is usually not a short moment. Depending on the used substrate and the used resin composition, the holding time in the present process may be for example at least 5 seconds, preferably at least 10 seconds, and more preferably at least 15 seconds.

In one embodiment, the present invention provides a process of impregnating which is characterized in that one of the main surfaces of a continuous substrate in the form of a layer which is supplied continuously is kept in contact with the resin composition in such a condition that the substrate is located on the resin composition.

In the above embodiment, referring to FIG. 1, the substrate 1 in the form of the layer is preferably supplied continuously at such an angle that the substrate is inclined from the horizontal condition. In this embodiment, a vessel 3 which contains the resin composition is in the form a pan which having a bottom surface in the form of a plate as shown in FIG. 1. When the substrate is fed while inclined, also the pan 3 is preferably inclined at the same angle as that of the substrate. Thus, there is substantially no problem from a practical viewpoint if the angle at which the substrate 2 is inclined is regarded to be substantially the same as θ shown in FIG. 1 (which corresponds to an angle at which the vessel 3 containing the resin composition is inclined, and which should be 0 degree in the horizontal condition).

The angle at which the substrate is inclined (0 degree of the angle corresponds to the horizontal condition) may be generally in the range between 0 and 90° (including 0 degree and 90 degrees), preferably in the range between 10 and 70°, more preferably in the range between 25 and 60°, and most preferably in the range between 30 and 45°, for example 30°, and the angle may be selected depending on the substrate to be used and the resin composition to be used as in case of the selection of the holding time of the contact condition as described above. Practically, it is sufficient to incline the vessel 3 at a specific angle as shown in FIG. 1. A separation (or distance) between the substrate and the bottom surface of the pan, namely a thickness (or a depth) of the body of the resin composition is dependent on the substrate to be used and the resin composition to be used, and it may be generally in the range between 0.5 and 30 mm, preferably in the range between 1 and 5 mm, and more preferably in the range between 1.5 and 3 mm, for example 2 mm.

Concretely, in the present impregnation process, when the elongated continuous substrate is fed while the resin composition is impregnated from the bottom main surface of the substrate, the resin composition is charged in and preferably flowed over an elongated pan which is inclined at a predetermined angle and the substrate is continuously supplied on the resin composition so that it covers an exposed surface of the resin composition (thus usually the substrate is substantially parallel to the pan). In this process, since the continuously supplied substrate continuously takes the resin composition away, the resin composition is preferably continuously replenished to the pan for the subsequent impregnation of the resin composition. In this embodiment, where the substrate and the pan are inclined, the resin composition flows down to an lower end of the pan. Thus, the resin composition flowing down which has not been impregnated is recovered at the lower end and recycled to an upper end of the pan, and then flowed down again after replenishing an amount of the resin composition which is substantially the same amount of the resin composition which has been impregnated into the substrate. A series of these operations (i.e. recovery, recycle, replenishment and flowing down) are preferably carried out in a continuous mode.

In the embodiment in which the pan and the substrate are inclined, a vessel may be preferably provided at the upper end of the pan so that the resin composition is charged therein and flowed from the upper end toward the lower end of the pan with overflowing the resin composition from the vessel. The substrate is fed along the same direction as that of the resin composition flow (therefore, the directions of the substrate feed and the resin composition flow are the same, so called parallel flow), which is preferable since the contact condition between the substrate and the resin composition is easily kept.

Even though the substrate is fed while it is kept horizontal, the resin composition is preferably replenished continuously since the substrate continuously entrains the resin compositions away. It is, of course, possible to replenish the resin composition batchwise, and in such embodiment, the substrate is to be lowered gradually toward the bottom of the pan.

In a more preferable embodiment, an enclosing mechanism such as a wind shield or a cover is provided over the main surface of the substrate which is opposed to the main surface in contact with the resin composition when the continuous substrate and the resin composition are kept in contact, so that the opposed surface is sealed off from effects due to its ambient circumstances, for example an effect due to an air flow by substantially being isolated from its ambient circumstances.

In a further more preferable embodiment, both of the main surface of the substrate are isolated from their ambient circumstances after the contact with the resin substrate (namely, after the substrate impregnated with the resin composition has been separated from the body of the resin composition). Similarly to the above, the effects due to the ambient circumstances are suppressed.

The present invention will be further explained in detail by way of an example in which a substrate is impregnated with a varnish composition with reference to the accompanied drawings.

FIG. 1 schematically shows one example of an impregnation apparatus with which the process of the present invention is carried out. The apparatus shown comprises a pan 3 to which the resin varnish 2 is supplied, and the pan is so arranged that it can be inclined at a predetermined angle (θ) from the horizontal condition of θ=0°. The pan 3 comprises a vessel 4 at its upper end to which the resin varnish is charged and a vessel 15 at its lower end which receives the resin varnish which has flowed over the pan but which has not been impregnated (thus the body of the resin composition at the lower end). The resin varnish 2 is supplied to the vessel 4 at a predetermined rate and overflows from the vessel 4 over the bottom plate of the pan 3 toward the lower end of the pan 3 with a predetermined thickness. Then, a non-impregnated portion of the resin varnish is collected in the vessel 15. The collected resin varnish is discharged through a port 17 and recycled to the vessel 4. As shown in FIG. 1, since the pan 3 is inclined at an angle of θ like a slide, the resin varnish flows down on the pan 3 by means of its own weight.

The continuous substrate 1 which is to be impregnated with the resin varnish may be of an elongated form like a belt and it may be glass cloth, glass paper or glass mat. The substrate is continuously fed to the apparatus, thus to the pan 3 for example at a predetermined constant speed from a relevant source (not shown), and so guided by a roll 18 just upstream from the pan 3 and a roll 19 just downstream from the pan 3 that only one main surface (i.e. bottom surface) of the substrate is kept in contact with the resin varnish flowing over the pan for a period after the substrate reaches the upper end of the pan, passing over the pan 3 and before the substrate leaves the lower end of the pan, and that the substrate leaves the pan 3 while keeping the contact condition with at least small amount of the resin varnish (namely, at least small amount of the resin varnish attaches to the bottom surface of the substrate).

In the embodiment shown in FIG. 1, the angle θ is about 30°. However, it should be noted that the angle may be substantially 0° or 90° in the present invention as described above.

In the process shown in FIG. 1, when the resin varnish 2 is overflowed from the vessel 4 and passed over the pan 3 while feeding the substrate as shown with an arrow in FIG. 1, the main bottom surface of the substrate 1 contacts with a liquid surface of the resin varnish 2 (namely, the body of the resin varnish), which penetrates gradually into the interior of the substrate from its bottom surface toward its top surface. Therefore, as the resin varnish penetrates into the substrate, air contained in the substrate 1 is vented from the top surface of the substrate so that substantially no air is left in the interior of the substrate, which means that the continuous substrate 1 is impregnated with the resin varnish 2 at an improved extent.

Principles under which the present process achieves the improved impregnation as described above can be easily understood based on the following considerations. However, it should be noted that those principles do not bind the present invention at all, and they merely propose one possibility that the present invention can be relatively reasonably explained. Basically, the present invention is essentially characterized by the maintenance of the contact condition between the substrate and the resin composition while the substrate is located on the resin composition.

Figure 4:
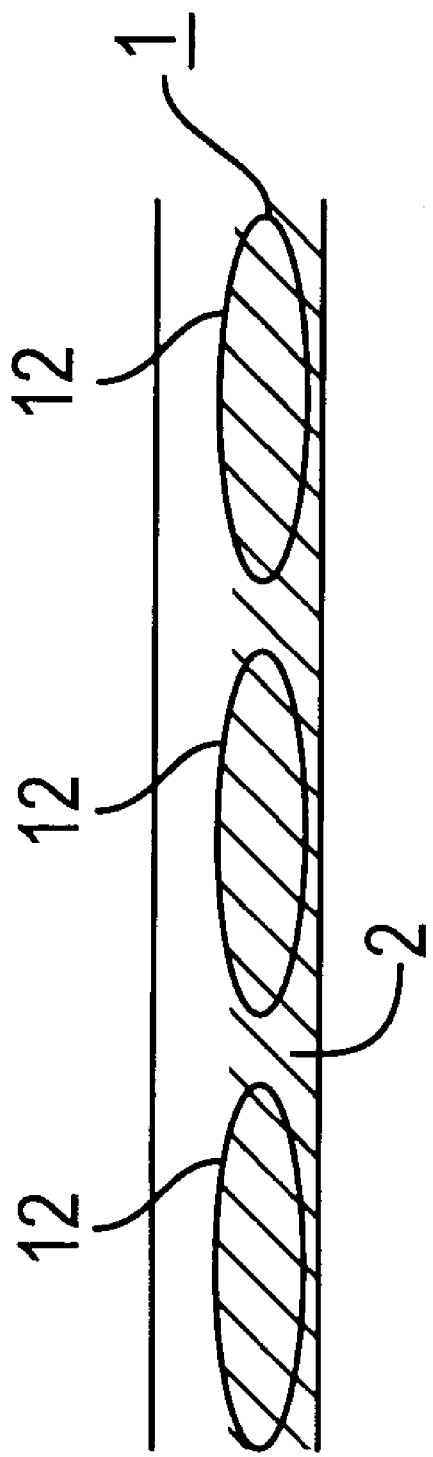
FIG. 4 schematically shows an impregnation mechanism according to the present invention.

The bottom main surface of the continuous substrate 1 merely contacts with the liquid surface of the resin varnish (i.e. the liquid surface), and substantially no pressure is applied positively to the resin varnish 2, so that the impregnation of the resin composition 2 into the continuous substrate 1 gradually proceeds from the bottom surface (or lower main surface) toward the top surface (or upper main surface) of the substrate by means of the capillary phenomenon as schematically shown with the shaded portion in FIG. 4 That is, a leading edge of the impregnated resin varnish portion proceeds through the substrate from its bottom surface toward its other (or top) surface.

Figure 7A:
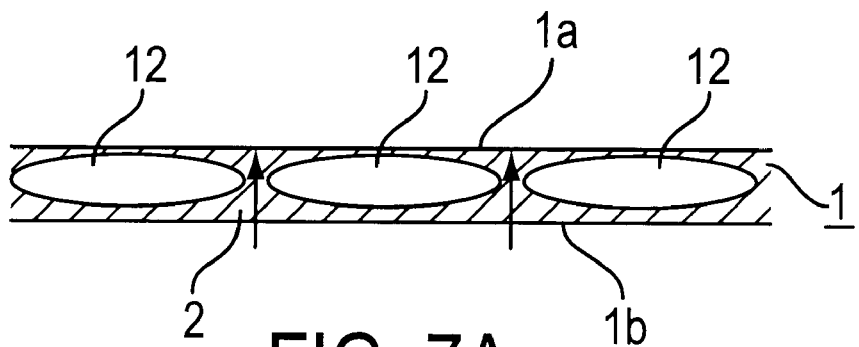
FIG. 7(a) schematically shows an impregnation mechanism of the prior art.
Figure 7B:
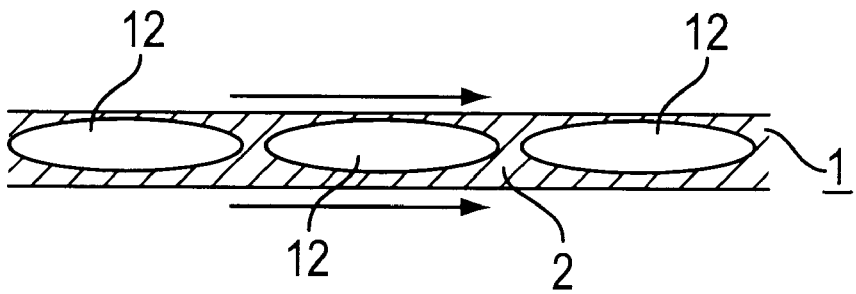
FIG. 7(b) schematically shows an impregnation mechanism of the prior art.

Thus, in the process according to the present invention, there occurs no situation in which when the resin varnish is pressed into the substrate as shown in FIG. 7(a), the resin varnish easily reaches the other main surface while the relatively wide interstices are preferentially filled with the resin varnish, and the resin varnish which has reached the other main surface seals the yarns so that air in the relatively smaller interstices has no place to escape. As a result, no air is confined in the interior of the yarns 12 in the present process. Thus, it is contemplated that in the present process, the resin varnish can be impregnated even into the interior of the yarns 12 by means of the capillary phenomenon so that non-impregnated portions do not left in the continuous substrate 1.

Figure 6:
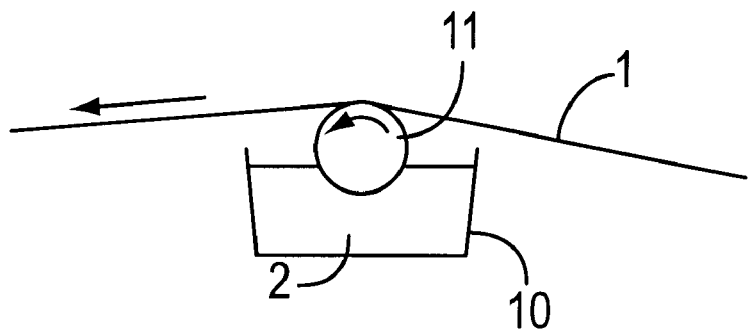
FIG. 6 schematically shows an apparatus with which the prior art impregnation is carried out.

As shown in FIG. 6, when the kill-roll 11 is used, it can only apply a limited amount of the resin varnish to the continuous substrate 1 substantially in the form a line. To the contrary, the process according to the present invention ensures that the resin varnish is kept in contact with the substrate throughout the period in which the substrate 1 proceeds from the upper end to the lower end of the pan 3. Thus, even though a feeding rate of the substrate is increased, it is ensured that a sufficient amount of the resin varnish is always present beneath the main surface of the substrate, which allows impregnation at a higher speed.

Figure 2:
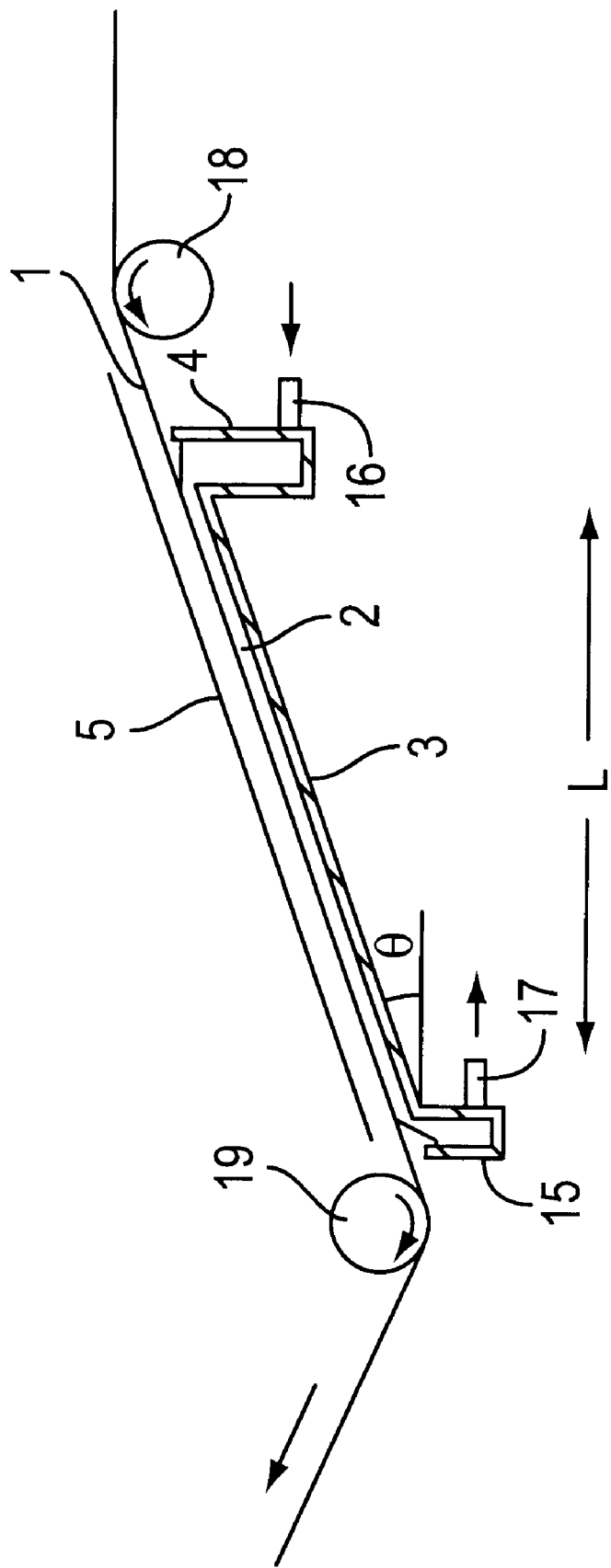
FIG. 2 schematically shows another embodiment of an apparatus with which the process according to the present invention is carried out.

FIG. 2 shows another embodiment of the present invention in which a cover such as a wind shield 5 is arranged to cover a portion of the substrate 1 which is in contact with the resin varnish 2, and thus a portion of another main surface (i.e. the top surface of the substrate) opposing to the surface which is in contact with the resin varnish 2 over the pan 3. When the continuous substrate 1 is covered by the wind shield 5 as shown, any effects caused from circumstances around the substrate, in particular an effect caused by surrounding air flow, is prevented from affecting the exposed substrate surface. For example, a component having a lower boiling point is prevented from evaporating from a leading edge of the impregnating resin varnish 2. Thus, it is contemplated that viscosity increase at the edge portion as shown in FIG. 4 (i.e. the upper surface of the shaded portion) is avoided so that the impregnation of the resin varnish 2 into the interior of the yarn 12 is not adversely affected.

Figure 3:
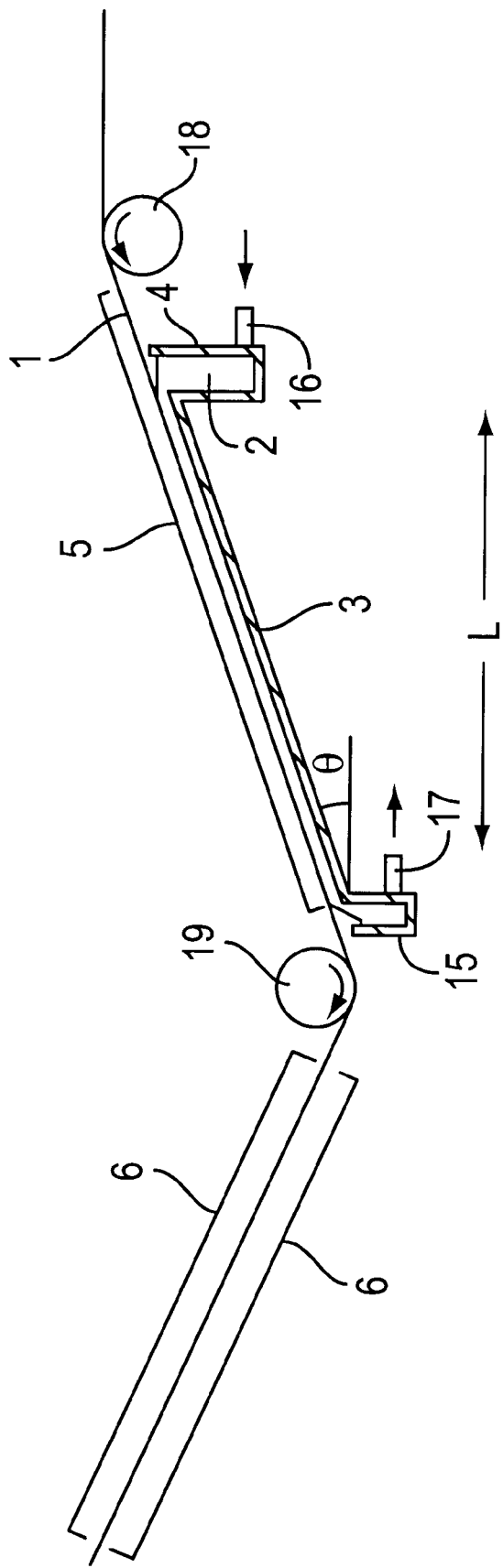
FIG. 3 schematically shows a further embodiment of an apparatus with which the process according to the present invention is carried out.

FIG. 3 schematically shows a further embodiment of the present invention in which, in addition to covering the continuous substrate over the pan 3 by means of the wind shield 5, the substrate 1 which has just left the pan 3 is passed through another wind shield 6. Thus, the continuous substrate is transported while any effect on the both main surfaces of the substrate which is caused from the circumstances around the substrate, in particular an effect caused by surrounding air flow, is likely to be prevented from affecting the impregnated substrate surfaces. Similarly to the above, the wind shield 6 prevents a leading edge portion of the impregnated resin varnish and an exposed surface of a resin varnish portion which is attached to or remaining on the bottom surface of the substrate from becoming more viscous, which further promotes the impregnation of the resin varnish into the inside of the yarns by means of the capillary phenomenon. That is, even when the impregnation of the substrate has not been completed before leaving the pan 3, the rest of the impregnation proceeds while the substrate is passed through the wind shield 6 without any effects from its circumstances. Thus, the present invention also provides the substrate having the resin composition impregnated therein which is prepared using the process according to the present invention.

After impregnating the continuous substrate 1 with the resin varnish 2, a prepreg is produced by passing such a substrate through an oven to heat and dry it, and optionally to cure at least a portion of the resin varnish 2. Then, one prepreg or two or more superimposed prepregs one on the other are formed into a laminate (in case one piece is formed, an formed sheet is obtained) while heat and optional pressure is applied. Alternatively, other various layers, for example a foil such as a metal foil may be placed on either or both sides of one prepreg or a two or more superimposed prepreg composite, which may be formed with heat and optional pressure into a metal clad laminate such as a copper clad laminate. In addition, by printing wiring process of the metal foil to form a circuit, a printed circuit board may be produced.

Alternatively, at least one substrate which has been impregnated with the resin composition according to the present invention and optionally at least one other layer may be superimposed, which is then formed and cured with heat and optional pressure so as to directly produce a laminate with bypassing the production of the prepreg.

Thus, the present invention also provides the prepreg produced by heating to dry and/or cure the substrate which is produced by the impregnation process according to the present invention, and also provides the laminate which is made from at least one substrate which is impregnated with the resin composition by the process according to the present invention.

EXAMPLES

The present invention will be explained more concretely by way of Examples and Comparative Examples.

Example 1

Using an apparatus as shown in FIG. 1, a continuous substrate 1 was impregnated with a resin varnish 2. As the resin varnish, a radically polymerizable thermosetting resin was used which was prepared by blending the following compound followed by vacuum degassing at a pressure of 0.1 atm for 30 minutes:

Vinyl ester resin (produced by Showa-Kobunshi (Japan), trade name of "S510") 100 parts by weight Radical polymerization initiator (produced by NOF Corporation (Japan), trade name of "Perbutyl O" 1 part by weight Styrene 6 parts by weight As the continuous substrate 1, glass cloth of a type defined as style 7628 type in ASTM D 579 was used which had a thickness of 0.18 mm and a width of 1000 mm (produced by Asahi-Schwebel Co., Ltd. (Japan), trade name "7628"), and it was continuously supplied at a rate of 2 m/min. The plate pan 3 was inclined at an angle of θ=30°, and a horizontal length of the plate pan 3 "L" was 1 m. The apparatus was so adjusted that a separation was about 2 mm between the continuous substrate 1 and the plate pan 3 and a flow rate of the resin varnish 2 was 10 l/min.

Example 2

Using an apparatus shown in FIG. 2, a substrate 1 was impregnated with a resin varnish 2. As the wind shield 5, a PET film was used and it was placed to cover all of the top surface of the substrate 1 over the pan 3 while keeping a separation of the film of about 50 mm from the top surface of the substrate 1. The other conditions were substantially the same as those in Example 1.

Example 3

Using an apparatus shown in FIG. 3, a substrate 1 was impregnated with a resin varnish 2. As the wind shield 6, PET films were used and it was placed over the both main surfaces of the substrate 1 along a substrate length of 1 m with each separation of about 50 mm from the main surface. The other conditions were substantially the same as those in Example 2.

Comparative Example 1

Figure 5:
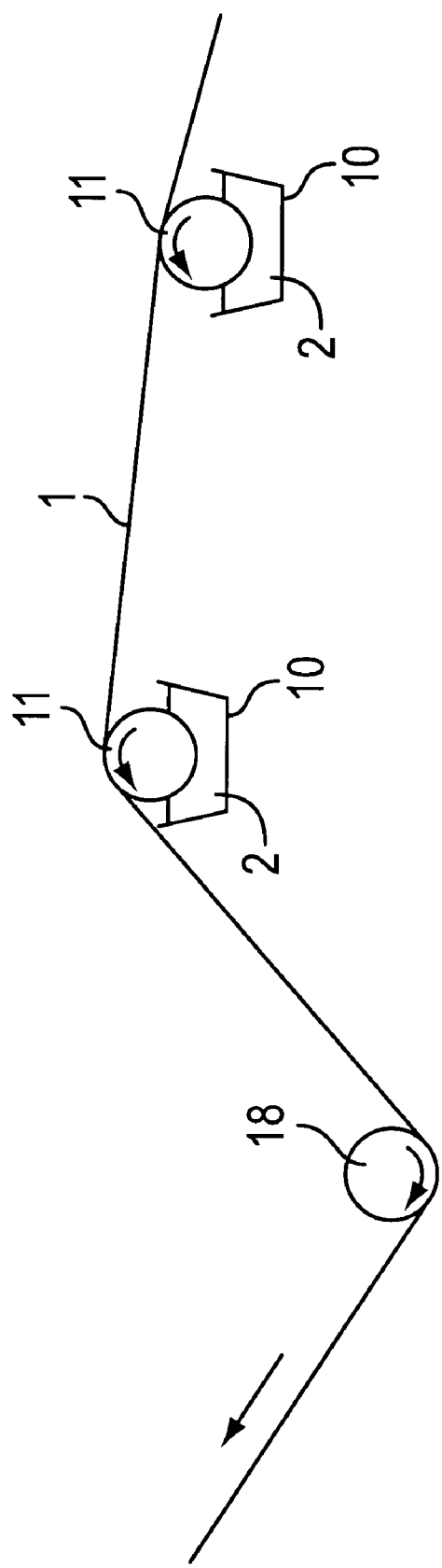
FIG. 5 schematically shows an apparatus which was used in Comparative Examples below.

Using a kiss-roll coating apparatus as shown in FIG. 5, a substrate 1 was impregnated with a resin varnish 2. Each kiss-roll 11 had a diameter of 130 mm and a separation between the kill-rolls was 2000 mm. The resin varnish 2 and the continuous substrate 1 and the feed rate of the substrate 1 were the same as those of Examples 1 to 3.

In each of Examples 1 to 3 and Comparative Example 1, the substrate was observed with naked eyes at a location of 3 m from the end of the impregnating portion of the substrate with the resin varnish (namely, the lower end of the pan 3 in Examples 1 to 3, and the downstream kiss-roll 11) toward the next step, and the results shown in Table 1 were obtained:

TABLE 1

| Example 1 | Example 2 | Example 3 | Comparative Example 1 |
| --- | --- | --- | --- |
| few non-impregnated portions observed | very few non-impregnated portions observed | substantially no non-impregnated portions observed | many non-impregnated portions observed |

As seen from Table 1, many non-impregnated portions were observed even after the substrate was passed over 3 m after application of the resin varnish in Comparative Example 1 while a few or substantially no non-impregnated portions were observed in Examples 1 to 3.

Examples 4 to 6

Three kinds of the resin composition as disclosed in Japanese Patent Application No. 8-64322 (referred to in the above) were prepared.

Production of Rubber-modified Vinyl Ester Resin

A rubber-modified vinyl ester resins which were used in the resin composition in Examples 4 to 6 were prepared as follows based on the components and their compositions shown in Table 2.

Carboxylic terminated acrylonitrile butadiene rubbers (liquid) (produced by Ube Industries, Ltd. (Japan), trade name of CTBN 1300×8 and CTBN 1300×13), an epoxy resin (produced by Toto Chemical Co., Ltd., (Japan), trade name of YDB-400, epoxy equivalent: 400), and hydroquinone as a polymerization inhibitor were weighed, charged into a four necked flask and melted with heat. Then, a triphenylphosphine (hereinafter, referred to as TPP) was added by an amount specified in Table 2 for the first step reaction and the reaction was carried out at a temperature of 100° C. to reach an acid value of less than 1.0 (the first step reaction). Thereafter, methacrylic acid (produced by Mitsubishi Rayon Co., Ltd.) and TPP (for the second step) both of which amounts are specified in Table 2 were added and the reaction was continued at a temperature of 120° C. to reach an acid value of less than 10.0 to have the rubber modified vinyl ester resin. The acid value was measured according to JIS K 6901.

TABLE 2

| | | Rubber modified vinyl ester resin | | |
| --- | --- | --- | --- | --- |
| | | Example 4 | Example 5 | Example 6 |
| Formu-lation (g) | CTBN 1300 × 13 | 49.8 | 18.7 | 31.2 |
| | CTBN 1300 × 8 | 49.8 | 18.7 | 31.2 |
| | Epoxy resin (YDB-400) | 583.6 | 635.4 | 614.7 |
| | Hydroquinone | 0.2 | 0.2 | 0.2 |
| | TPP (for the 1st step reaction) | 0.34 | 0.34 | 0.34 |
| | Methacrylic acid | 116.8 | 127.2 | 123.1 |
| | TPP (for the 2nd step reaction) | 0.4 | 0.4 | 0.4 |
| Ratio of rubbery polymer (wt %) | | 12.45 | 4.68 | 7.80 |

Preparation of Resin Composition

The rubber modified vinyl ester resin produced as above and other components were mixed in a ratio shown in Table 3 below to prepare the resin composition as disclosed in Japanese Patent Application No. 8-64322. The resin composition contained a radical polymerization initiator (produced by NOF Corporation (Japan), trade name of PERCUMYL H) in an amount of 1 part by weight based on the total amount of the components shown in Table 3. Tables 2 and 3 include a calculated ratio of the rubbery polymer to the resin composition.

TABLE 3

| | | Example 4 | Example 5 | Example 6 |
| --- | --- | --- | --- | --- |
| Formu-lation (wt %) | Rubber modified vinyl ester resin | 64 | 64 | 64 |
| | Styrene | 22 | 25 | 27 |
| | Acrylic acid | 6 | 6 | 0 |
| | Methacrylic acid | 0 | 0 | 6 |
| Ratio of rubbery polymer (wt %) | | 8 | 5 | 3 |

Styrene (produced by Nippon Steel Chemical Co., Ltd. (Japan))

Acrylic acid (produced by Mitsubishi Petrochemical Co., Ltd. (Japan))

Example 1 was repeated except that the resin composition prepared as above was used and the feed rate of the substrate was 1 m/min.

Comparative Examples 2 to 4

The impregnation was carried out by repeating Examples 4 to 6 except that the apparatus used in Comparative Example 1 was used in place of employing the process of the present invention, and the feed rate of the substrate was 1 m/min.

As in above Examples 1 to 3 and Comparative Example 1, thus impregnated substrates were subjected to the test with naked eyes and the results thereof are shown in Tables 4 and 5 below.

TABLE 4

| Example 4 | Example 5 | Example 6 |
| --- | --- | --- |
| few non-impregnated portions observed | very few non-impregnated portions observed | substantially no non-impregnated portions observed |

TABLE 5

| Comparative Example 1 | Comparative Example 2 | Comparative Example 3 |
| --- | --- | --- |
| many non-impregnated portions observed | many non-impregnated portions observed | many non-impregnated portions observed |

As seen from the above results, the present process achieves the improved impregnation compared with the kiss-roll coating.

Examples 7 to 9

The impregnation of the substrate was carried out by repeating Example 1 except that the following resin composition was used, the feed rate of the substrate was changed and the angle of the inclined substrate was changed, and then the impregnated substrate was heated to dry to a temperature of 180° C., so that the prepreg was prepared of which resin weight was about 51% by weight after drying.

Formulation of Resin Composition

Epoxy resin (1): Tetrabromobisphenol A type (produced by Toto Chemical Co., Ltd. (Japan), trade name YDB-500, epoxy equivalent: 500) 94 parts by weight Epoxy resin (2): Cresol novolak type (produced by Toto Chemical Co., Ltd. (Japan), trade name YDCN-220, epoxy equivalent: 220)

13 parts by weight

Curing agent: Dicyandiamide 2.8 parts by weight

Curing promoter: 2-ethyl-4-methylimidazol 0.1 parts by weight

Solvent: N,N-dimethylfolmamide 25 parts by weight

The epoxy resins (1) and (2) are solid.

The feed rate of the substrate and the inclined angle were changes as shown in Table 6 below:

TABLE 6

|  | Example 7 | Example 8 | Example 9 |
|---|---|---|---|
| Substrate feed rate | 5 m/min. | 5 m/min. | 3 m/min. |
| Inclined angle | 30° | 10° | 90° |

Comparative Example 5

Using the apparatus used in Comparative Example 1 (kill-roll coating apparatus), the substrates were impregnated with the resin composition used in Examples 7 to 9. The feed rate of the substrate was 3 m/min.

A test piece (10 cm×10 cm) was cut out of the prepreg produced by impregnating and heating in each of Examples 7 to 9 and Comparative Example 5, and the piece was hung in an electric oven at a temperature of 163° C. for 15 minutes followed by cooling, and then observed with naked eyes as to the non-impregnated portions. The results are shown in Table 7 below:

TABLE 7

| Example 7 | Example 8 | Example 9 | Comparative Example 5 |
|---|---|---|---|
| substantially no non-impregnated portions observed | very few non-impregnated portions observed | few non-impregnated portions observed | many non-impregnated portions observed |

As seen from Table 7, the present process achieves the improved impregnation even at the inclined angle of 90°. Further, even though the feed rate of the substrate is increased, the improved impregnation is achieved compared with the kiss-roll coating.

As easily understood from the above including the description and the results of the Examples and the Comparative Examples, the following main effects are obtained according to the present invention:

When the substrate is impregnated with the resin composition from its bottom surface while the substrate is continuously fed, since the substrate and the body of the resin composition are kept in such a contact condition that the substrate is on the body of the resin composition, a force acting on the substrate can be reduced as much as possible so that the resin composition can be impregnated by means of the capillary phenomenon, which reduces the non-impregnated portions left.

By contacting the resin composition with the bottom surface of the continuous substrate on the resin composition in such a condition that the substrate is inclined while the resin composition is flowed over the plate pan and the substrate is fed continuously substantially parallel to the bottom plate of the pan, the contact of the resin composition with the substrate can be kept so as to continue the impregnation all the time from when a certain portion of the substrate reaches the upper end of the plate pan to when said certain portion of the substrate leaves the lower end of the plate pan. Thus, even though the feed rate of the substrate is increased, the impregnation is carried out with a sufficient amount of the resin composition being always present beneath the bottom surface of the substrate, so that the high speed impregnation is possible.

Where the vessel to which the resin composition is charged is placed at the upper end of the plate pan and the resin composition is overflowed from the upper end to flow it over the pan, a substantially uniform thickness of the resin composition is ensured across the width (perpendicular to the flow direction of the resin composition) of the plate pan, so that uniform impregnation of the continuous resin is easily achieved across its width.

In addition, in a region where the substrate and the resin composition are kept in contact condition, when the main surface of the substrate opposing to the main surface which is in contact with the resin composition is covered by the shielding mechanism which isolates such surface from its ambient circumstances (such as the wind shield), any adverse effect to the main surface of the continuous substrate is avoided as much as possible, which prevents the low boiling point component from evaporating from the leading edge of the impregnating resin composition portion, whereby the viscosity increase in the leading edge is prevented. Thus, the effective impregnation by means of the capillary phenomenon is ensured, resulting in the improved impregnation.

What is claimed is:

1. A process for impregnating a substrate with a liquid resin composition, the substrate including opposing upper and lower surfaces, and openings providing liquid communication between the upper and lower surfaces, comprising:

contacting the lower surface of the substrate with a top surface of a body of liquid resin composition while the upper surface is substantially free; and maintaining contact of the lower surface on said top surface of the liquid resin composition while the substrate is inclined at an angle in a range between 10° and 70° from a horizontal position for a period of time to impregnate the substrate.

2. The process according to claim 1, wherein the substrate comprises an elongated material which is supplied continuously.

3. The process according to claim 1, wherein the resin composition flows down at an angle which is substantially the same as the angle of the substrate, and the substrate is fed along a same direction as a direction of flow of the resin composition.

4. The process according to claim 1, further including at least one wind shield over at least a portion of the substrate.

5. The process according to claim 4, wherein the wind shield comprises a wind shield over the upper surface of the substrate.

6. The process according to claim 5, wherein the wind shield over the upper surface of the substrate covers a portion of the substrate during the maintaining contact with the liquid resin composition.

7. The process according to claim 6, further including at least one additional wind shield over the substrate subsequent to the maintaining contact with the liquid resin composition.

8. The process according to claim 7, wherein the at least one additional wind shield comprises a lower wind shield over the lower surface of the substrate, and an upper wind shield over the upper surface of the substrate.

9. The process according to claim 1, wherein the substrate comprises glass cloth, glass paper or glass mat.

10. The process according to claim 1, wherein the resin composition comprises:

(A) a rubber-modified vinyl ester resin obtained by reacting:
  (a) an epoxy resin,
  (b) a member selected from the group consisting of an amino group, a carboxylic group containing polymer derived from a conjugated diene, and mixtures thereof, and
  (c) a member selected from the group consisting of acrylic acid, methacrylic acid and mixtures thereof,
(B) a radically polymerizable monomer; and
(C) a radical polymerization initiator.

11. The process according to claim 10, wherein the resin composition contains, as the component (B), styrene and an OH group containing monomer which is radically polymerizable, and an amount of the OH group containing monomer is 4 to 8% by weight based on total weight of the resin composition.

12. The process according to claim 1, wherein the period of time is at least 5 seconds.

13. The process according to claim 12, wherein the period of time is at least 10 seconds.

14. The process according to claim 13, wherein the period of time is at least 15 seconds.

15. The process according to claim 1, wherein the substrate is kept in contact with the resin composition while the substrate is inclined at an angle in a range between 25° to 60° from a horizontal position.

16. The process according to claim 1, wherein the substrate is kept in contact with the resin composition while the substrate is inclined at an angle in a range between 30° to 45° from a horizontal position.

17. The process according to claim 1, wherein the substrate is kept in contact with the resin composition while the substrate is inclined at an angle of 30° from a horizontal position.

* * * * *

UNITED STATES PATENT AND TRADEMARK OFFICE
CERTIFICATE OF CORRECTION

PATENT NO.    : 6,143,369
DATED         : November 7, 2000
INVENTOR(S)   : Y. Sugawa et al.

It is certified that error appears in the above-identified patent and that said Letters Patent is hereby corrected as shown below:

<u>Title page,</u>
Item [56], References Cited, U.S. Patent Documents, the following references were omitted and should be included :

|            |        |                  |             |
|------------|--------|------------------|-------------|
| -- 4,767,643 | 8/1998 | Westervelt et al. | 427/541     |
| 3,632,374  | 1/1972 | Greiller         | 117/34      |
| 4,652,493  | 3/1987 | Reichmann et al. | 428/423.1 -- |

Signed and Sealed this

Thirtieth Day of October, 2001

Attest:

Attesting Officer

NICHOLAS P. GODICI
Acting Director of the United States Patent and Trademark Office